United States Patent [19]
Neuenfeldt et al.

[11] Patent Number: 5,036,677
[45] Date of Patent: Aug. 6, 1991

[54] AIR CONDITIONER HAVING IMPROVED STRUCTURE FOR COOLING ELECTRONICS

[75] Inventors: Douglas L. Neuenfeldt, Coon Rapids; David E. Thielman, Brooklyn Park, both of Minn.

[73] Assignee: McLean Midwest Corporation, Brooklyn Park, Minn.

[21] Appl. No.: 404,284

[22] Filed: Sep. 7, 1989

[51] Int. Cl.$^5$ .............................. F25D 23/12
[52] U.S. Cl. .................... 62/259.1; 62/263; 62/448
[58] Field of Search .......... 62/263, 259.1, 448

[56] References Cited

U.S. PATENT DOCUMENTS

| | | | |
|---|---|---|---|
| 2,321,688 | 6/1943 | Kucher | 62/263 X |
| 2,914,927 | 12/1959 | Corhanidis | 62/448 X |
| 3,871,188 | 3/1975 | Vold et al. | 62/263 X |
| 4,013,120 | 3/1977 | Rheinheimer | 62/263 X |
| 4,424,684 | 1/1984 | Waldschmidt et al. | 62/263 X |
| 4,424,686 | 1/1984 | Lapeyre et al. | 62/263 X |

FOREIGN PATENT DOCUMENTS 2724880 12/1978 Fed. Rep. of Germany .
2556329 3/1979 Fed. Rep. of Germany .

*Primary Examiner*—Lloyd L. King
*Attorney, Agent, or Firm*—Henry C. Kovar

[57] ABSTRACT

An air conditioner having improved internal structure and intended specifically for cooling electronic enclosures has a cabinet containing a compresser, evaporator and condenser coils, a load air blower, an ambient air blower, and a single motor connected to both blowers. The interior of the cabinet is divided by upper and lower horizontal dividers into upper, central and lower compartments. The upper compartment is divided into a separate ambient air intake compartment and a separate load air intake compartment with both blowers and the motor being in the load intake compartment. The evaporator coil and the ambient intake compartment and associated structure are asymetrical as is the compresser installation. The load air inlet and outlet are on the back, the ambient inlet is on a side and the ambient outlet is on the bottom. This new air conditioner is of exceptionally small physical size for its cooling capacity and is relatively quiet and easy to manufacture.

20 Claims, 4 Drawing Sheets

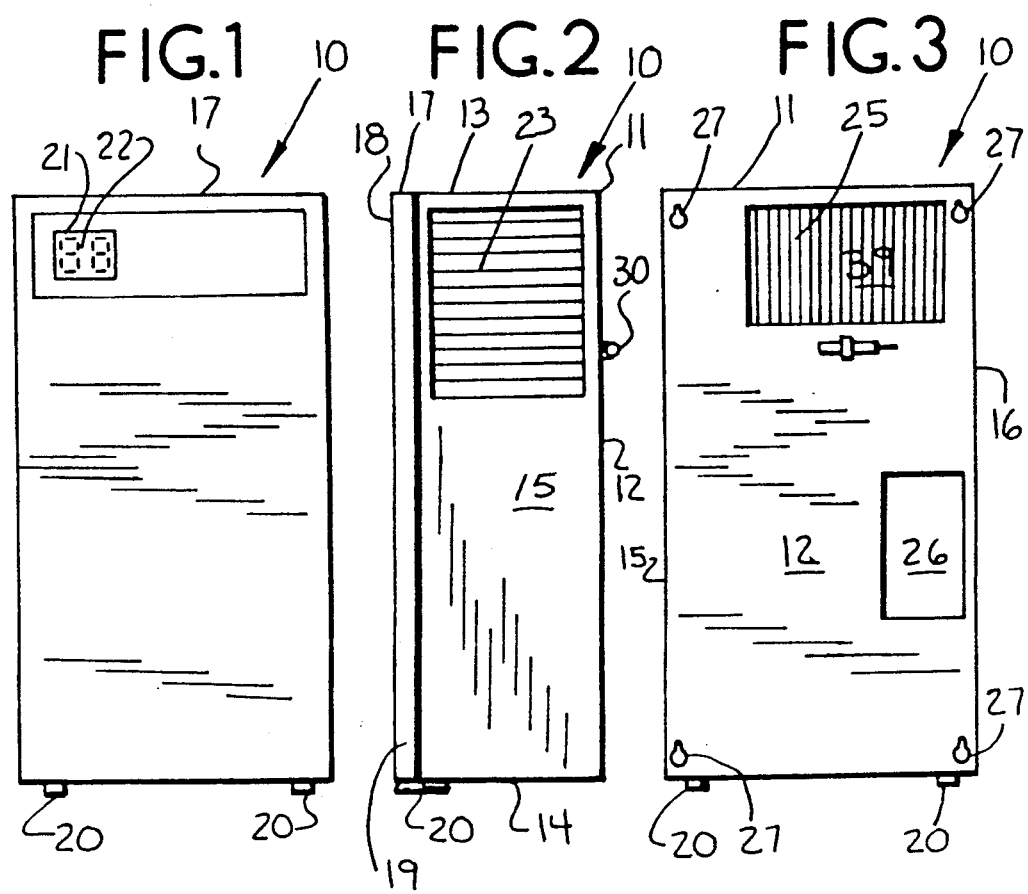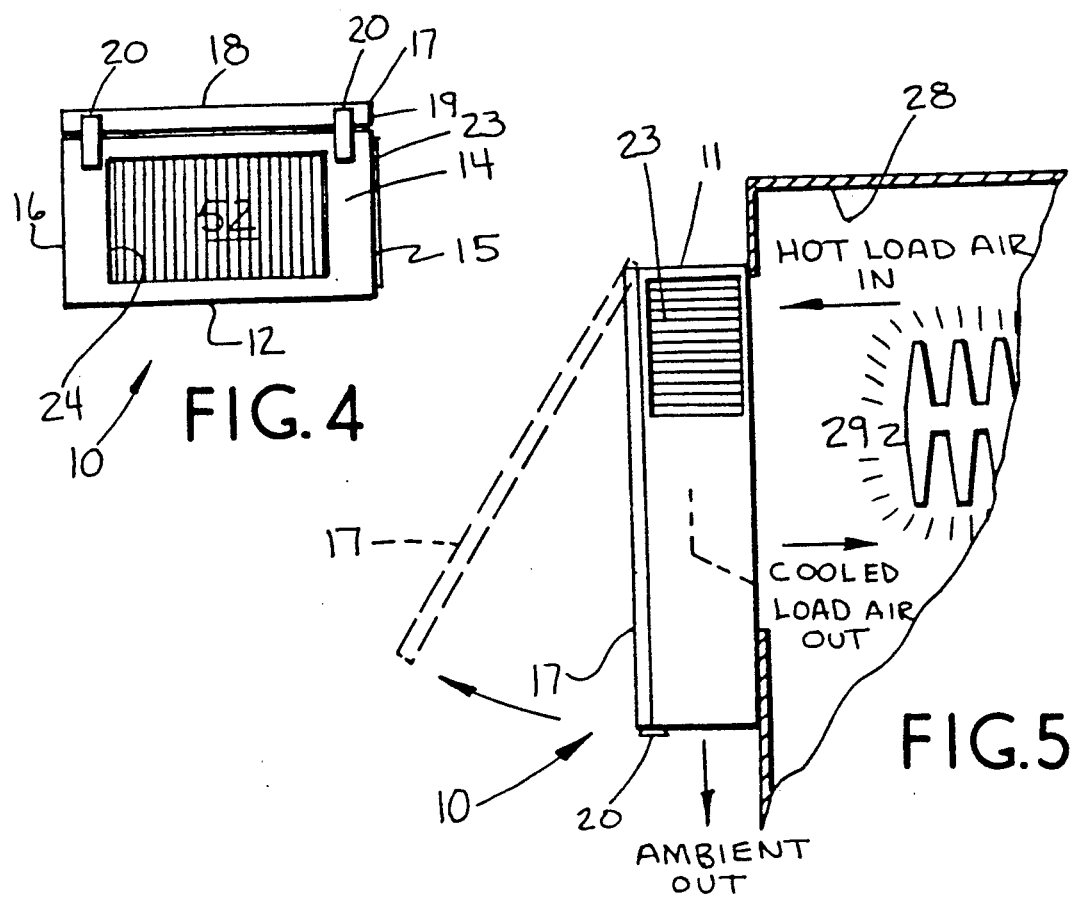

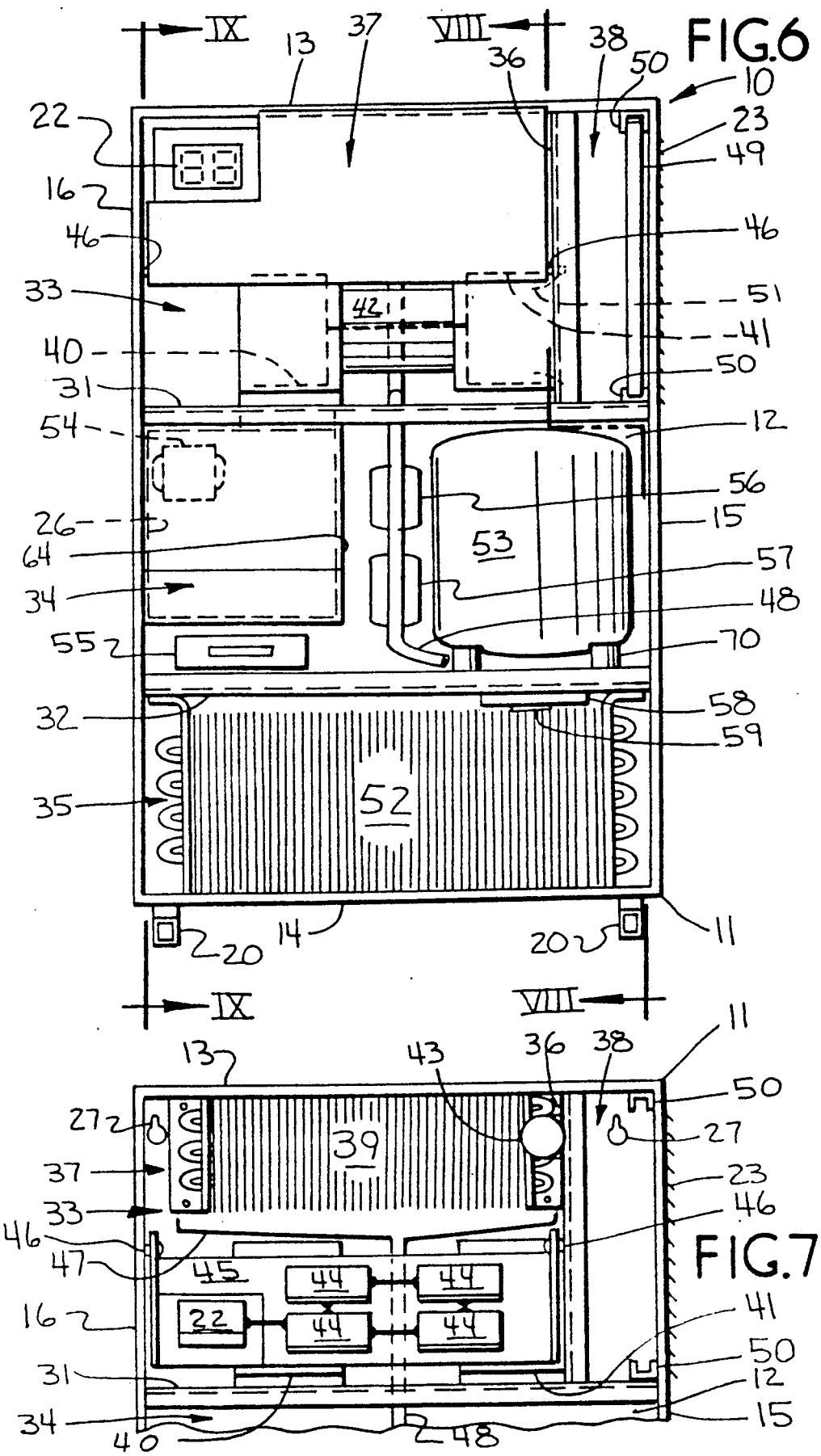

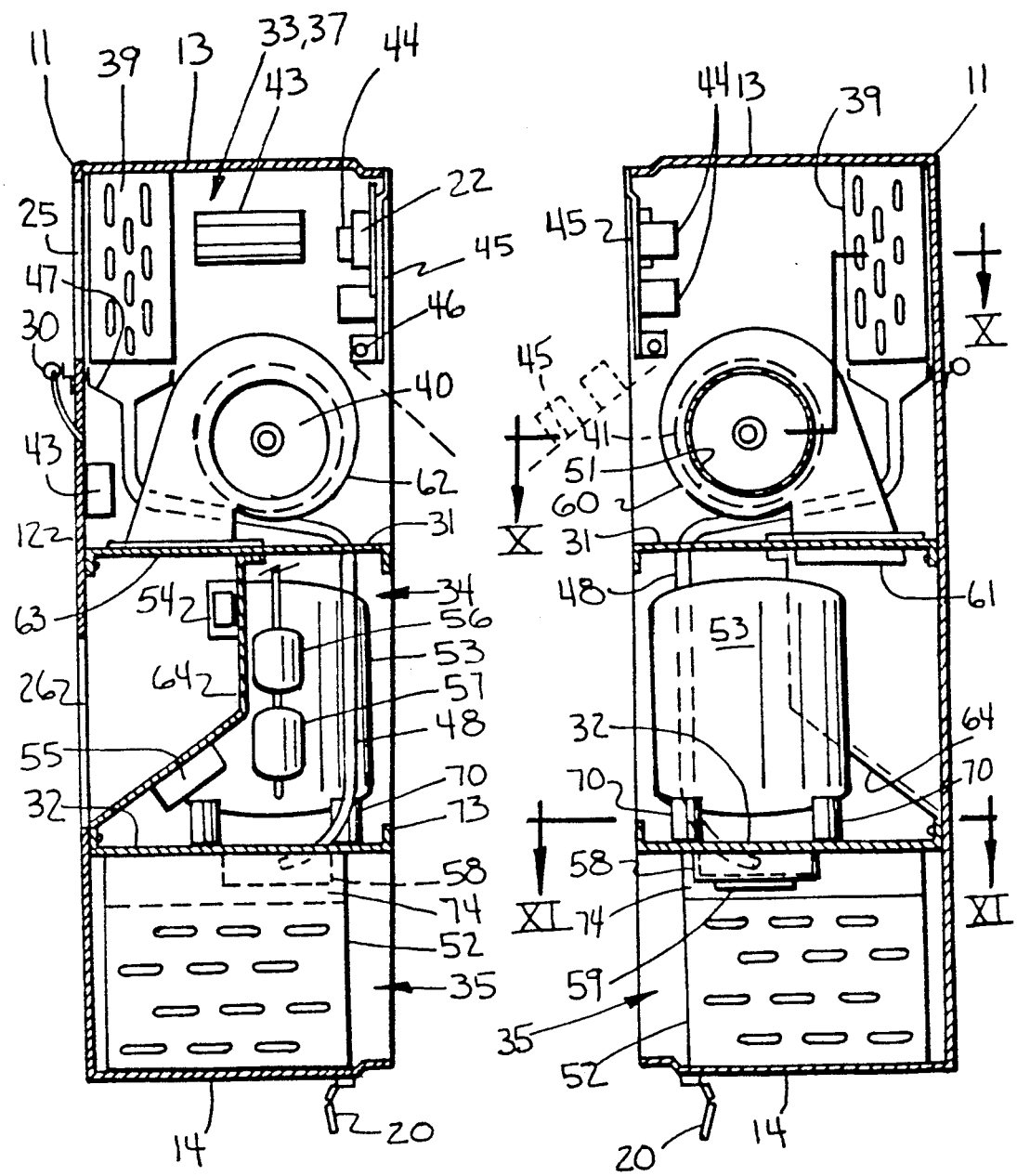

AIR CONDITIONER HAVING IMPROVED STRUCTURE FOR COOLING ELECTRONICS

BACKGROUND OF THE INVENTION

1. Field of the Invention

This invention pertains to an air conditioner having an improved internal structure that is particularly useful for cooling electrical/electronic enclosures.

2. The Prior Art

The existing air conditioners for enclosures are relatively large and bulky, and have opposed inlet/outlet structure that is considered relatively noisy. These conditioners are also unusually expensive.

In industrial air conditioners for the cooling of machine tools and electronics, there are many existing problems. Condensate evaporators are add-on structures with uncertain performance. Transformers for high voltage units are discrete add-on structures. Most of these units have two discrete blowers and two motors; service or replacement of these motors and blowers is difficult and requires significant disassembly of the unit. The ambient air filters are on the outside of the units. The units are of modular design and do not break down for service or replacement of componentry. The existing industrial conditioners are quite large and heavy for their relative performance. The noise level of industrial conditioners is quite high, due amongst other things to the face that the blower outlets are proximate to cabinet outlets. The electronic and electromechanical control components are usually on the condenser side and are kept warm which requires higher cost componentry and reduces service life. Service and cleaning of existing industrial conditioners has been difficult and has required significant disassembly of the units.

OBJECT OF THE INVENTION

It is an object of this invention to provide a new and improved industrial air conditioner to be used for climate control of electrical/electronic enclosures and/or other enclosed heat loads, and improved methods of using these air conditioners.

It is an object of this invention to provide an improved air conditioner having internal condensate evaporators and a method therefore.

It is an object of this invention to provide an improved industrial air conditioner having a voltage reduction transformer internally mounted in a cooled space within the conditioner.

It is an object of this invention to provide an improved air conditioner having either singularly, or in combination, easy service removal and replacement of a single blower motor for two blowers, an enclosed slide out and reversible air filter, a front cover with removal accomplished without tools providing access to the interior of the conditioner, reduced physical size, simplified mounting of the electronics, reduced noise level due to improved and less noisy air flow, improved environmental blower motor protection, improved located and service of internal electronics, and improved serviceability for ambient coil cleaning which allows direct washdown.

SUMMARY OF THE INVENTION

An improved air conditioner has a load inlet and outlet on a back side, a side ambient inlet and a bottom ambient outlet, separate load and ambient blowers, and a single motor for both blowers, the blower motor is in the cooled air stream.

An improved air conditioner has a cabinet divided into upper, central and lower zone, with the upper zone being sub divided into ambient inlet and load inlet zones.

Many other advantages, features and additional objects of the present invention will become manifest to those versed in the art upon making reference to the detailed description and accompanying drawings in which the preferred embodiment incorporating the principles of the present invention is set forth and shown by way of illustrative example.

BRIEF DESCRIPTION OF THE DRAWINGS

FIG. 1 is an elevational view of the front side of the preferred embodiment of an air conditioner according to the present invention;

FIG. 2 is a side elevational view projected from FIG. 1;

FIG. 3 is a rear elevational view projected from FIG. 2;

FIG. 4 is a bottom plan view projected from FIG. 1;

FIG. 5 is a side elevational view of the air conditioner of FIG. 1 installed and in use;

FIG. 6 is a front elevational view of the conditioner of FIG. 1, with the cover removed;

FIG. 7 is a second front elevational view of the structure of FIG. 6, with the electronics panel opened for access;

FIG. 8 is an elevational sectional side view taken through lines VIII—VIII of FIG. 6;

FIG. 9 is an elevational sectional side view taken through lines IX—IX of FIG. 6;

DESCRIPTION OF THE PREFERRED EMBODIMENT

Figure 10:
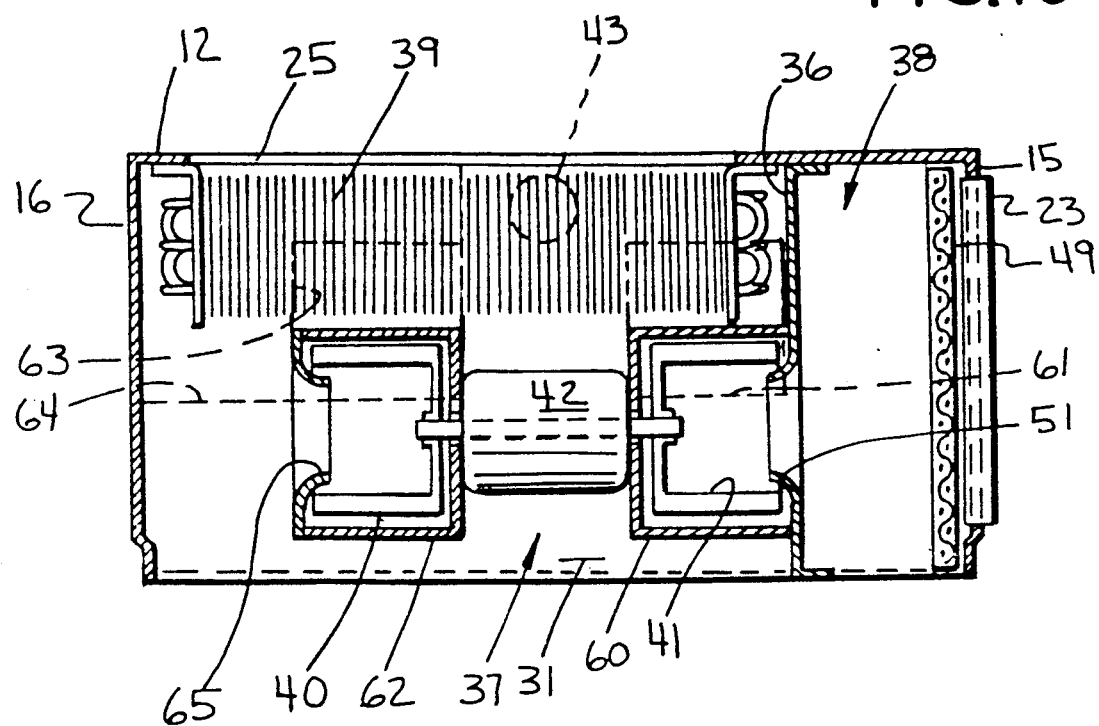
FIG. 10 is a plan sectional view taken through lines X—X of FIG. 8.

The preferred embodiment of the air conditioner of the present invention is shown in FIGS. 1 through 5 and is generally indicated by the numeral 10, and hereinafter referred to as the conditioner 10 for brevity The conditioner 10 has a cabinet box 11 formed of a single piece of sheet metal and having a back panel 12, a top panel 13, a bottom panel 14, a right side panel 15 and a left side panel 16 which is shown later. On the front side of the cabinet box 11 is a cover 17 having a front panel 18 and a complete circumfrential flange 19. The cover 17 hangs from the top of flange 19 and is locked to the box 11 by a pair of two-piece latches 20 on the bottom 14 and the bottom of the cover flange 19. The front panel 18 has a window 21 through which an internal diagnostic indicator 22 is visible. An ambient air inlet 23, is on one of the sides 15, 16 and is shown on the right side 15. The ambient air outlet 24 is in the bottom 14. The hot load air inlet 25 is in the back 12 as is the cooled load air outlet 26. The box 11 has mounting structure, such as slotted keyholes 27 for hanging and securement of the conditioner 10 to larger structures such as the electrical/electronic controls enclosure 28 which will have a heat load structure 29 therein. A load air temperature sensing thermister or bulb 30 is adjacent the load air inlet 25 and preferably on the cabinet back 12.

In FIG. 5, the conditioner is shown on the enclosure 28. Heated load air coming off the heat load 29 is drawn in the load inlet 25, cooled, and expelled from the load air outlet 26 and back into the enclosure 28. The ambient air is drawn in the ambient inlet 23, heated and expelled out of the ambient outlet 24. The cover 17 is removable from the box 11 by unlocking the latches 20 and swinging the bottom of the cover 17 outward to the alternate position shown in dotted lines in FIG. 5. The cover 17 is then lifted and removed and separated from the box 11.

The important features of this invention are in the inside of the conditioner 10, to the inside of the cabinet box 11 and cover 17 as shown in FIG. 6. An upper generally horizontal cabinet divider 31 and a lower generally horizontal cabinet divider 32 divide the interior of the cabinet 11 into an upper intake compartment 33, a central component compartment 34, and a lower outlet compartment 35. The upper compartment 33 is further divided by a generally upright divider 36, into a load inlet compartment 37 and an ambient inlet compartment 38. The horizontal dividers 31, 32 are fastened to the cabinet back 12 and sides 15, 16, and the upright divider 36 is fastened to the cabinet top 13 and the upper divider 31. Within the load inlet compartment 38 are an evaporator coil 39, a load air blower 40, an ambient air blower 41, a single motor 42 for both blowers 40, 41, capacitors 43 for the motor 42, and compresser 53, the diagnostic indicator 22 and the indicator functional support and refrigeration control electronic components 44 for the conditioner. The indicator 22 and electronic components 44 are mounted to a rotatable door 45 that is mounted on hinge pins 46. A condensate collection tray 47 is under the evaporator coil 39 and has a condensate drain tube 48 extending downward and out of the load inlet compartment 37.

Within the ambient inlet compartment 38 is a full compartment depth and full compartment height removable and cleanable air filter element 49 that slides in and out of a pair of opposed and generally C-shaped tracks 50. In FIG. 7, the electronics door 45 is shown open to provide access for cleaning the evaporator coil 39, and the ambient filter element 49 has been removed for cleaning. An ambient air inlet port 51 is provided through the upright divider 36 and into the ambient air blower 41.

Within the lower compartment 35 is a condenser coil 52 having transverse refrigerant tubes and upright fins. The condenser coil 52 is fastened to and suspended from the lower divider 32.

Within the central compartment 34 and between the upper and lower dividers 31, 32 are the refrigerant compresser 53, a transformer 54 for dropping line voltage down to lower voltage, a refrigerant high - low pressure safety and on - off device 55, a refrigerant filter 56 and a refrigerant accumulator 57. The refrigerant suction and discharge lines are not shown, for reasons of clarity. The condenser coil 52 is full width and symetrical about the vertical centerline of the conditioner 10 whereas the evaporator coil 39 is of a lesser width than the conditioner 10 and of a width that fits within the load intake compartment 37, however the evaporator coil 39 has a width which is greater than half of the width of the conditioner 10. The evaporator coil 39 and the load air inlet 25 and load air outlet 24 are offset to the side opposite of the ambient inlet compartment 38 and the compresser 53. A condensate evaporation tray 58 is in the lower compartment 35 and is fastened to and supported by the lower divider 32. The condensate tray 58 is directly under the compresser 53 and is sized to be smaller than a footprint of the compresser 53. On the bottom side of the condensate tray 58 is a silicone embedded electrical heater element 59 with an internal thermostatic on - off switch.

In FIG. 8, which is a sectional view from the right side, the arrangement of some components can be clearly seen, including the ambient air inlet port 51 to the ambient blower 41 which has a scroll 60 with an outlet 61 that is directed downward through the upper divider 31 and into the central compartment 34.

In FIG. 9 which is a sectional view from the left side, the load ar blower 40 is shown with a scroll 62 having an outlet 63 directed downward and through the upper divider 31 and into a cooled load air conduit 64 in and extending through the central compartment 34 to the load air outlet 26. The transformer 54 is preferably within the cooled air plenum or conduit 64.

FIG. 10 shows how ambient air is drawn through the filter element 49 and into the ambient inlet compartment 38 and through the inlet port 51 to the ambient blower 41. The blower 41 subsequently discharges the ambient air through the outlet 61 and into the central compartment 34. The load blower 40 draws load air through the evaporator coil 39 and into the load inlet compartment 37 and then through an load inlet port 65 and into the load air blower 40. The load blower 40 and scroll 62 discharge cooled load air downward through the load outlet 63 and into the plenum or conduit 64 and then out of the load outlet 24.

Figure 11:
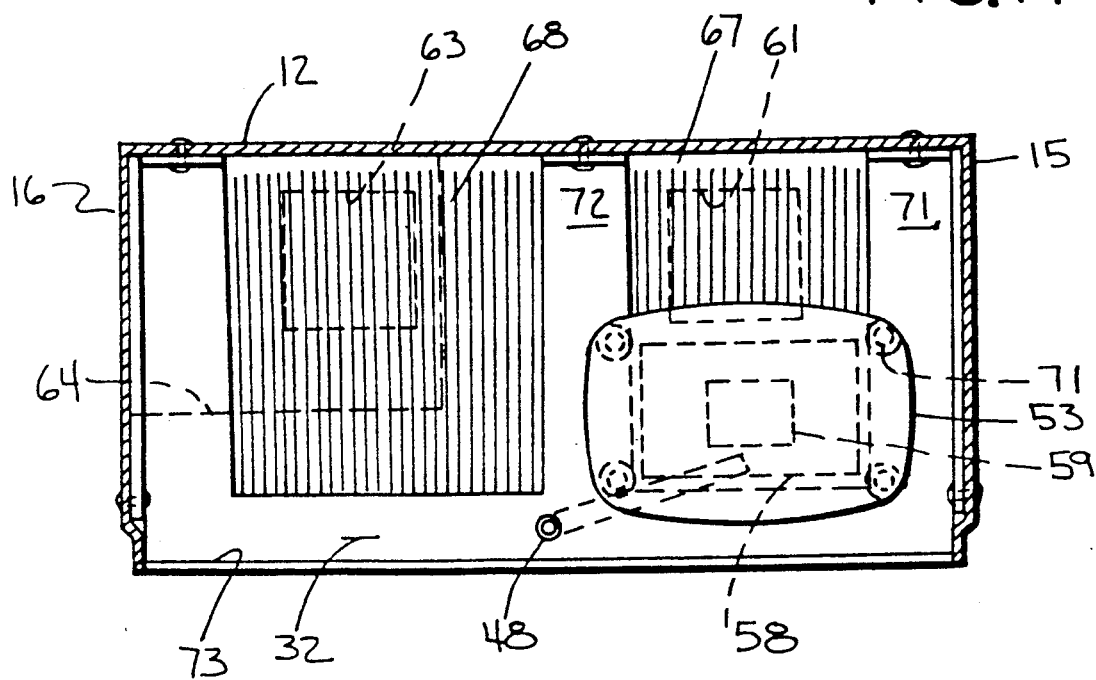
FIG. 11 is a plan sectional view taken through lines XI—XI of FIG. 8.

FIG. 11 is a plan view of the lower divider 32 and shows that the lower divider 32 has an inverted generally M shape with a firSt air passage 67 being directly under and in focus with the ambient blower outlet 61, and a second passage 68 is under the cooled air conduit 64 and the load blower outlet 63. The compresser 53 is secured to four studs 70 which in turn are secured to a side leg 71 and a central leg 72 of the lower divider 32. The condensate tray 58 and heater 59 are directly under the compresser 53 so that ambient air can effectively flow through the first passageway 67 around and to the rear of the compresser 53. There is a small air distribution plenum 74 between the lower divider 32 and the condenser coil 52.

The cover 17 normally closes all of the compartments 33, 34, 35, 37, 38 and the dividers 31, 32 each have a front flange 73 that abutts against the inside of the cover 17.

The cover 17 can be removed without tools. The door 45 enables quick access to the electronics 44 which are normally within the coolest compartment 37 of the conditioner 10. The cooled air is drawn over the electronics 44. There are no outside fasteners. Only a single motor 42 is necessary for both blowers 40, 41, and cold air is drawn over the blower motor 42. The condensate tray 58 will take care of all normal condensate, any excess condensate will be drained out the bottom 14. The conditioner 10 can be deployed either with or without a filter.

The relative cooling capacity of the conditioner 10 is very high. A ¾ h.p. unit puts out 6000 actual BTU with 60 Hz electric power.

The conditioner 10 can be easily and safely cleaned with either a vacuum or a steam cleaner.

Although other advantages may be found and realized and various modifications may be suggested by those versed in the art, be it understood that we embody within the scope of the patent warranted hereon, all such embodiments as reasonably and properly come within the scope of our contribution to the art.

We claim as our invention:

1. An air conditioner comprising
   a) a cabinet having a box with back and sides, and an openable cover;
   b) an upper generally horizontal divider and a lower generally horizontal divider inside of and fastened to said box, said dividers dividing the interior of said cabinet into upper, central and lower compartments;
   c) a refrigeration compresser in said central compartment;
   d) a condenser coil in said lower compartment;
   e) means dividing said upper compartment into a separate load air inlet compartment and a separate ambient air inlet compartment;
   f) an evaporator coil in said load air inlet compartment; and
   g) a load air blower and ambient air blower and a single electric motor connected to said blowers, said blowers and said motor all being in said load air inlet compartment.

2. The air conditioner of claim 1 including an ambient air outlet extending downward through said upper divider, an ambient air passageway through said lower divider, and an ambient air outlet from said lower compartment.

3. The air conditioner of claim 1 including a load air blower outlet extending downward through said upper divider, a load air outlet from said central compartment and through said cabinet back, and a cooling air conduit in said central compartment.

4. The air conditioner of claim 1 in which both said blowers are mounted atop of and to said upper divider.

5. The air conditioner of claim 1, said corner having a single front panel covering the front side of all said compartments, said dividers including means for effectively sealing against a backside of said front panel for obstruction of air flow between the dividers and the front panel, and wherein opening of said cover provides direct access into all said compartments.

6. The air conditioner of claim 1, in which said blower and said motors are mounted directly in front of said evaporator coil.

7. The air conditioner of claim 6, in which said evaporator coil is immediately in front of said cabinet box back, and in which said inlet compartment dividing means extends from the cover to the back and past an outer one end of said evaporator coil.

8. The air conditioner of claim 7, in which a second end of said evaporator coil is adjacent one said cabinet box side, and in which said one outer end is spaced inward from a second said cabinet box side, said dividing means being upright and between said one outer end and said second cabinet box side, said air inlet compartments being along side each other.

9. The air conditioner of claim 6, in which an upright planar ambient air filter is retained in between said dividing means and said second cabinet side.

10. The air conditioner of claim 9, in which said air filter is a full depth air filter extending the full depth from said cabinet box back to said cover.

11. A relatively quiet air conditioner having enclosed moving componentry which is easily accessed for cleaning, service or replacement, comprising:
    a) a cabinet box having a back, a top, a bottom, and a pair of opposed sides;
    b) an openable front cover secured to and normally airtightly closing the front of said box;
    c) an operative refrigeration system having a compressor, a condenser and an evaporator inside of said cabinet box;
    d) a divider within said cabinet box which divides a load air cooling compartment from the remainder of the interior of the cabinet box, said compartment being normally closed on the front by said cover, and having said evaporator therein;
    e) a load air passageway extending through said normally closed cooling compartment, said load air passageway having aload air inlet and a load air outlet through said back, said load air inlet and outlet being air tightly securable to an enclosure having a heat load therein;
    f) a load air blower, an ambient air blower, and electric motor means for operating said blowers, said blowers and said motor means being in said load air passageway;
    g) a transverse ambient air inlet through one of said cabinet sides to said ambient air blower;
    h) an ambient air blower outlet extending physically through said divider and fluidly out of said load air passageway to said condenser, said condenser being outside of said compartment, said cover obstructing outlet of ambient air from said cabinet and from said condenser; and
    i) an ambient air outlet from said cabinet box, said ambient air outlet being through said cabinet box between said back and said cover.

12. The air conditioner of claim 11, in which said divider is generally horizontal and said cooling compartment is in an upper compartment in said cabinet box, and including an upright divider dividing said upper compartment into said load cooling compartment and an ambient air inlet compartment having means for holding an upright ambient air filter within said cabinet box.

13. An industrial air conditioner for cooling enclosures having electrical componentry therein, comprising
    a) a compressor operatively connected to a condenser and an evaporator coil;
    b) a load air passageway having an air inlet and an air outlet air tightly connectable to the interior of said enclosure, said evaporator coil being in said passageway;
    c) blower means within said passageway for moving enclosure load air through the passageway and through said evaporator coil;
    d) a voltage lowering transformer within said passageway and downstream of said evaporator coil for providing reduced voltage to said air conditioner and for integrated cooling of said transformer;
    e) an electric motor operatively connected to said blower, said motor also being within said passageway and downstream of said evaporator coil;
    f) electronic controls for the air conditioner, said controls being within said passageway and downstream of said evaporator coil;
    g) blower motor and compressor capacitors within said passageway and downstream of said evaporator coil;
    h) an exterior cabinet cover closing at least a portion of said passageway, said cover being openable for providing access to said motor, said controls and said capacitors; and i) a swing out door inside of said cover, said controls being mounted on said door and being outwardly swingable with said door to a position of access outside of said passageway.

14. The air conditioner of claim 13, in which said door is normally held in a closed position of said cover.

15. The air conditioner of claim 13, including a diagnostic indicator in said passageway, said indicator being externally visible through a window in said cover.

16. The air conditioner of claim 15, in which said indicator is mounted on said door.

17. The air conditioner of claim 13, in which said load air inlet and an ambient air inlet are at the same level.

18. An industrial air conditioner for cooling enclosures having electrical componentry therein, comprising a) a compressor operatively connected to a condenser and an evaporator coil;

b) a load air passageway having an air inlet and an air outlet air tightly connectable to the interior of said enclosure, said evaporator coil being in said duct;

c) load blower means within said passageway for moving enclosure load air through the passageway and through said evaporator coil;

d) an electric motor operatively connected to said blower, said motor also being completely within said passageway;

e) an ambient air blower in an ambient air passageway extending through the condenser, said ambient air blower being operatively connected to and driven from within the load air passageway by a single said electric motor; and in which f) said ambient air blower is completely within said load air passageway.

19. The air conditioner of claim 18, in which said ambient air blower has a transversely facing blower air inlet behind an imperforate front air conditioner cover, said ambient blower air inlet being spaced inwardly from a transverse ambient air inlet in a side of said air conditioner by an ambient inlet compartment alongside said passageway.

20. The air conditioner of claim 18, in which said load air inlet and an ambient air inlet are at the same level, said inlets being normal to each other.

* * * * *